US005315071A

United States Patent [19]
Tanimichi

[11] Patent Number: 5,315,071
[45] Date of Patent: May 24, 1994

[54] LINE BRANCHING PRINTED CIRCUIT BOARD FOR A COMPUTER NUMERICAL CONTROLLER

[75] Inventor: Akihiro Tanimichi, Minamitsuru, Japan

[73] Assignee: Fanuc Ltd., Minamitsuru, Japan

[21] Appl. No.: 834,565

[22] PCT Filed: May 28, 1991

[86] PCT No.: PCT/JP91/00721
§ 371 Date: Feb. 14, 1992
§ 102(e) Date: Feb. 14, 1992

[87] PCT Pub. No.: WO92/00659
PCT Pub. Date: Jan. 9, 1992

[30] Foreign Application Priority Data
Jun. 22, 1990 [JP] Japan .................. 2-164957

[51] Int. Cl.[5] .................. H01R 23/68
[52] U.S. Cl. .................. 174/254; 361/785
[58] Field of Search .................. 364/138, 140, 141; 371/11.3; 340/825.06, 826.01, 825.79; 307/141, 115, 113; 361/413, 777, 785; 174/254

[56] References Cited
U.S. PATENT DOCUMENTS
4,963,824 9/1990 Hsieh et al. .................. 324/158

FOREIGN PATENT DOCUMENTS
56-38076 9/1981 Japan .
58-21785 5/1983 Japan .
59-141677 9/1984 Japan .
61-96481 6/1986 Japan .

Primary Examiner—A. D. Pellinen
Assistant Examiner—Aditya Krishnan
Attorney, Agent, or Firm—Staas & Halsey

[57] ABSTRACT

A line branching printed circuit board for a computer numerical controller designed to branch an input/output signal line connecting a computer numerical controller and a numerically controlled machine tool, and comprising a first circuit board connector (20A) coupled to a junction connector to which input/output signal lines from the computer numerical controller are connected, and a plurality of second circuit board connectors (21aA, 21bA and 21cA) which are all coupled to the junction connectors to which the input/output signal lines to the numerically controlled machine tool are connected, and having pins pattern-connected to the pins of the first circuit board connector. There is further provided a third circuit board connector (22A) having pins pattern-connected to the spare pins of the first circuit board connector (20A) and the spare pins of the plurality of second circuit board connectors (21aA, 21bA and 21cA). A connection changing connector (22B) is attached to the third circuit board connector (22A), to determine the connection of the pins of the third circuit board connector, and by changing the connection of the connection changing connector, the connection between the computer numerical controller and the numerically controlled machine tool can be easily changed.

8 Claims, 3 Drawing Sheets

LINE BRANCHING PRINTED CIRCUIT BOARD FOR A COMPUTER NUMERICAL CONTROLLER

BACKGROUND OF THE INVENTION

1. Field of the Invention

The present invention relates to a line branching printed circuit board for a computer numerical controller, and more particularly, to a line branching printed circuit board for a computer numerical controller which permits an easy change of the branching of input/output signal lines between a computer numerical controller and a numerically controlled machine tool.

2. Description of the Related Art

The input/output signal lines between a computer numerical controller and a numerically controlled machine tool are branched on the way from an input/output circuit of the computer numerical controller to the individual control circuits of the numerically controlled machine tool.

Conventionally, such a line branching is made on a line branching panel, and the terminals of the line branching panel are wire-wrapped for connection, but currently, line branching printed circuit boards are used to branch signal lines. The use of a line branching circuit board eliminates erroneous connections and permits an easy line branching, and therefore, line branching printed circuit boards are extremely advantageous particularly when producing standardized products or for mass production.

As mentioned above, when an input/output signal line between a computer numerical controller and a numerically controlled machine tool was branched using a conventional line branching panel, the terminals of the line branching panel were wire-wrapped for connection. This required skill and time, and further, were liable to result in an erroneous connection.

Also, in the conventional line branching printed circuit board for a computer numerical controller, the pins of a particular connector of the input/output signal line of the computer numerical controller are keyed to and connected to the pins of a particular connector of the input/output signal line of the numerically controlled machine tool, because of a pattern-based connection, and accordingly, the input/output signal lines between the computer numerical controller and the numerically controlled machine tool are fixed. Therefore, if it becomes necessary to increase the number of the input/output signals between the computer numerical controller and the numerically controlled machine tool, or to change the signal route, then the pattern on the line branching printed circuit board must be cut and a plating wire must be soldered to the pattern by hand, and thus any change in the branching of an input/output signal line takes much time.

SUMMARY OF THE INVENTION

The present invention is intended to solve the above-mentioned problem, and the object of the present invention is to provide a line branching printed circuit board for a computer numerical controller which permits an easy change of a line branching.

To fulfill the aforementioned object, a line branching printed circuit board for a computer numerical controller, which is designed to branch an input/output signal line between a computer numerical controller and a numerically controlled machine tool, is provided. The line branching printed circuit board comprises a first circuit board connector connected to a junction connector to which an input/output signal line from the computer numerical controller is connected, a plurality of second circuit board connectors individually connected to the junction connectors to which the input/output signal lines to the numerically controlled machine tool are connected, the pins thereof being pattern-connected to the pins of the first circuit board connector, a third circuit board connector having pins pattern-connected to spare pins of the first circuit board connector and spare pins of the plurality of the second circuit board connectors, and a connection changing connector attached to the third circuit board connector for selecting the pins of the third circuit board connector which are to be connected.

Regular input/output signals between a computer numerical controller and a numerically controlled machine tool are transferred through the junction connector to the line branching printed circuit board, the first circuit board connector, patterns provided between the first circuit board connector and a plurality of the second circuit board connectors, and a plurality of the second circuit board connectors.

The number of input/output signals transferred between a computer numerical controller and a numerically controlled machine tool can be increased or changed by changing the connection of the pins of the third circuit board, which serve as a relay point between the spare pins of the first circuit board connector and the spare pins of a plurality of the second circuit board connectors. The connection of the pins of the third circuit board connector is changed by changing the connection of the junction terminals of the connection changing connector.

DESCRIPTION OF THE PREFERRED EMBODIMENT

An embodiment of the present invention is described hereinafter with reference to the accompanying drawings.

Figure 3:
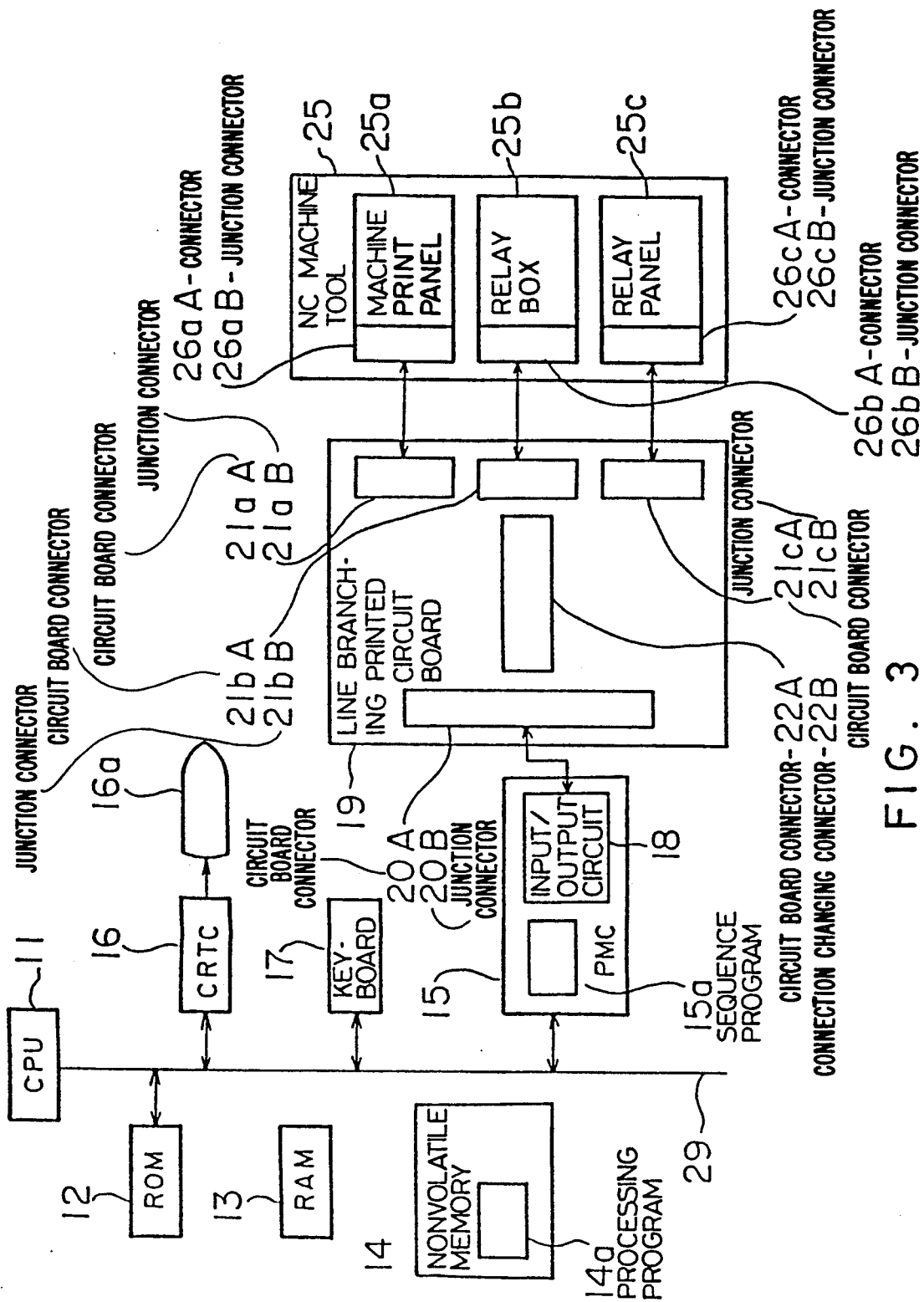
FIG. 3 is a schematic block diagram of a computer numerical controller (CNC) for implementing the present invention.

FIG. 3 is a schematic block diagram of a computer numerical controller (CNC) for implementing the present invention. As shown in this figure, a processor 11 controls the entire computer numerical controller in accordance with a system program stored in a ROM 12, which is an EPROM or EEPROM. A RAM 13, which is an SRAM, stores various types of data, and a nonvolatile memory 14 stores a processing program 14a, parameters and the like; this is a CMOS or the like backed up by a battery, and thus information stored therein will be retained even after power supplied to the computer numerical controller is cut off.

A PMC (programmable machine controller) 15 receives commands for a function M, function S and function T, and the like, reads and processes those commands according to a sequence program 15a, and then outputs signals for controlling a numerically controlled machine tool 25 accordingly. Further, in response to a limit switch signal received from the numerically controlled machine tool 25, or to a switch signal received from a machine operator panel 25a, processing is performed according to the sequence program 15a and a signal is output to control the numerically controlled machine tool 25. Signals necessary to the computer numerical controller are transferred to the RAM 13 via a bus 29 and read by the processor 11.

A graphic control circuit 16 converts data such as the present position and amount of movement of each axis stored in the RAM 13 into display signals which are sent to a display unit 16a and displayed thereat as data. The display unit 16a uses a CRT, a liquid crystal display or the like, and a keyboard 17 is used to enter various types of data.

An input/output circuit 18 transfers input/output signals to and from the numerically controlled machine tool 25. More specifically, the input/output circuit 18 receives switch signals from the machine operator panel 25a of the numerically controlled machine tool 25, limit switch signals from a relay box 25b, and relay signals from a relay panel 25c, and the PMC 15 reads these signals. The input/output circuit 18 also receives signals for controlling a pneumatic actuator and the like of the numerically controlled machine tool 25, from the PMC 15, and supplies those signals to the numerically controlled machine tool 25.

A line branching printed circuit board 19 is located between the input/output circuit 18 and the numerically controlled machine tool 25, and input/output signals transferred among the computer numerical controller, the machine operator panel 25a of the numerically controlled machine tool 25, the relay box 25b, and the relay panel 25c are transferred through a signal path which consists of the input/output circuit 18, a junction connector 20B, a circuit board connector 20A, three circuit board connectors 21aA, 21bA and 21cA, and another three junction connectors 21aB, 21bB and 21cB on the line branching printed circuit board 19, and three junction connectors 26aB, 26bB and 26cB, and another three connectors 26aA, 26bA and 26cA on the numerically controlled machine tool 25.

In the drawing, an axis control circuit for controlling a servomotor, a servoamplifier, the servomotor, a pulse coder, a spindle control circuit for controlling the spindle, a spindle amplifier, a spindle motor, and the like are omitted.

In this embodiment, only one processor is used, but a multiprocessor system also can be configured by using a plurality of processors, according to the required application of the system.

Figure 2:
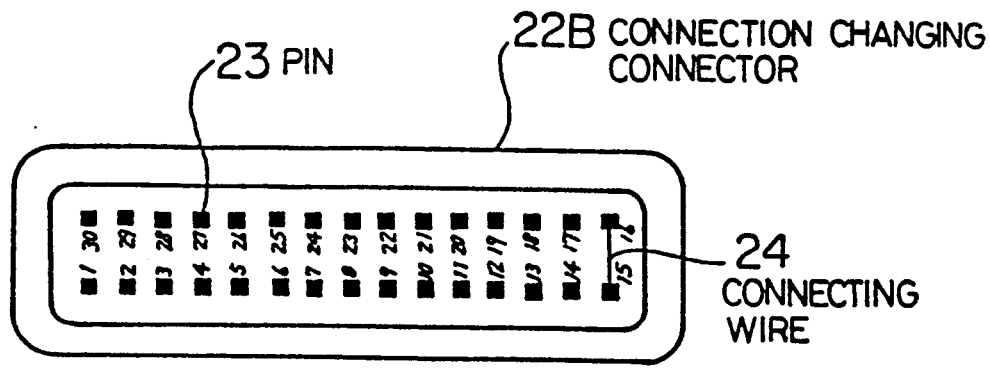
FIG. 2(a) is a plan view of a connection changing connector according to the present invention.
FIG. 2(b) is a front view of a connection changing connector according to the present invention.
Figure 2:
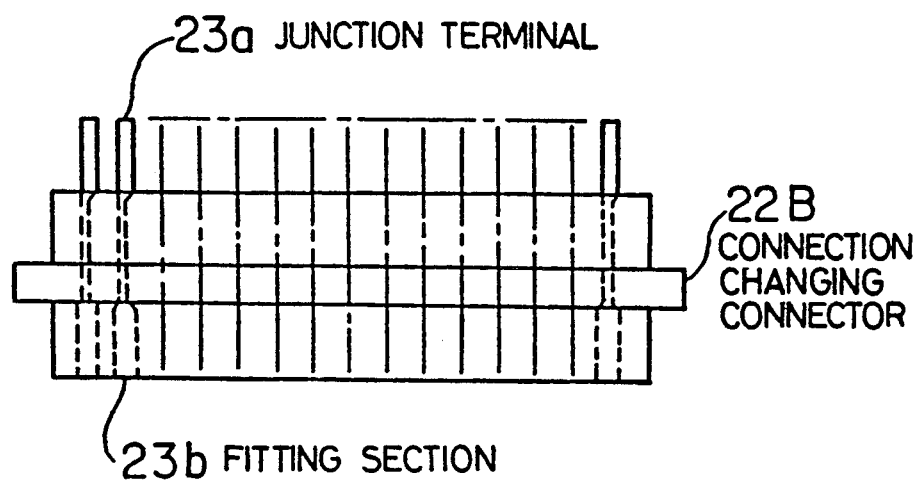

FIG. 2(a) is the plan view of the connection changing connector according to the present invention, and FIG. 2(b) is the front view of the connection changing connector according to the present invention. In the drawings, a connection changing connector 22B is a 30-pin connector, and the top part of a pin 23 forms a junction terminal 23a for wrapping, the bottom part of the pin 23 forms a fitting section 23b to be fitted to a pin of a mating connector 22A (as described later), and the connections between the junction terminals 23a are made by wrapping connecting wires 24 therearound.

Figure 1:
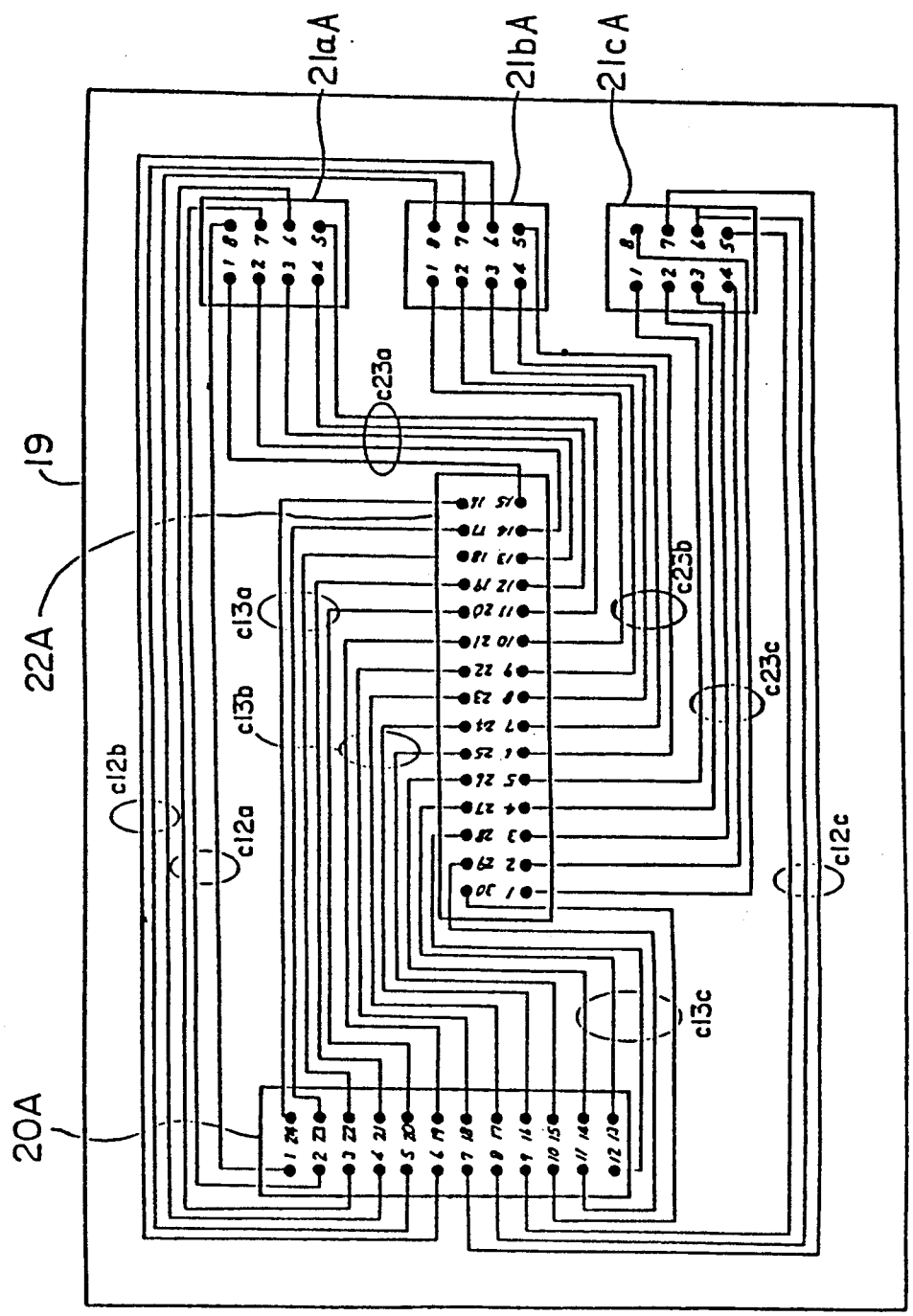
FIG. 1 shows the layout of the connectors and the patterns on a line branching printed circuit board according to the present invention.

FIG. 1 shows the layout and patterns of the connectors on the line branching printed circuit board according to the present invention. In the drawing, the line branching printed circuit board 19 is provided with connectors on the front surface and printed patterns on the back surface. For a convenient explanation, the patterns on the back surface are shown by solid lines.

The first circuit board connector 20A is a 24-pin connector, the second three circuit board connectors 21aA, 21bA and 21cA are 8-pin connectors, and the third circuit board connector 22A is a 30-pin connector.

Three pins of the first circuit board connector 20A are pattern-connected to the pins of a second circuit board connector 21aA, and the patterns for the three pins are as indicated by a symbol c12a. Similarly, the first circuit board connector 20A and a second circuit board connector 21bA are connected with three patterns indicated by c12b, and the first circuit board connector 20A and a second circuit board connector 21cA are connected with three patterns denoted by c12c.

Fifteen spare pins of the first circuit board connector 20A are divided into three batches, each consisting of 5 pins, and are pattern-connected to the pins of the third circuit board connector 22A. The patterns of the 5-pin batches are denoted by c13a, c13b and c13c.

Five spare pins of the second circuit board connector 21aA are pattern-connected to the pins of the third circuit board connector 22A. This 5-pin pattern is denoted by a symbol c23a. Five spare pins of the second circuit board connector 21bA are connected to the pins of the third circuit board connector 22A through a pattern c23b, and five spare pins of the second circuit board connector 21cA are connected to the pins of the third circuit board connector 22A through a pattern c23c. Accordingly, none of the spare pins of all of the connectors linked to the pins of the third circuit board connector 22A are connected to a circuit, i.e., the pins of the third circuit board connector 22A serve as a relay terminal.

The function of the line branching printed circuit board 19 is now described by first showing the standard case. A signal path for transferring input/output signals between the input/output circuit 18 of the computer numerical controller and the machine operator panel 25a of the numerically controlled machine tool 25 is configured as follows: three signal lines from the input/output circuit 18 leave pin Nos. 1, 2 and 3 of the first circuit board connector 20A, pass through the pattern c12a, and reach pin Nos. 6, 7 and 8 of the second circuit board connector 21aA. The second circuit board connector 21aA is connected to the machine operator panel 25a.

Similarly, a signal path for transferring input/output signals between the input/output circuit 18 of the computer numerical controller and the relay box 25b of the numerically controlled machine tool 25 is configured as follows: three signal lines from the input/output circuit 18 leave pin Nos. 4, 5 and 6 of the first circuit board connector 20A, pass through a pattern c12b, and reach pin Nos. 6, 7 and 8 of the second circuit board connector 21bA. The second circuit board connector 21bA is connected to the relay box 25b.

Further, the signal path for transferring input/output signals between the input/output circuit 18 of the computer numerical controller and the relay panel 25c of the numerically controlled machine tool 25 is configured as follows: three signal lines from the input/output circuit 18 leave pin Nos. 7, 8 and 9 of the first circuit board connector, pass through a pattern c12c, and reach pin Nos. 6, 7 and 8 of the second circuit board connector 21cA. The second circuit board connector 21cA is connected to the relay panel 25c.

Next, the function of the line branching printed circuit board 19 is discussed for the case wherein one signal line is added to meet an increase in the number of input/output signals. In this example, one signal line is added to the input/output signal lines connecting the input/output circuit 18 of the computer numerical controller and the machine operator panel 25a of the numerically controlled machine tool 25.

The additional input/output signal line from the input/output circuit 18 is connected to pin No. 24 of the first control board connector 20A via the junction connector 20B; pin Nos. 10 through 24 of the first circuit board connector 20A are spare pins; and pin No. 24 of the first circuit board connector 20A is connected to pin No. 16 of the third circuit board connector 22A via one of the lines of the pattern c13a. Therefore, by connecting pin Nos. 16 and 15 of the third circuit board connector 22A, pin No. 1 of the second circuit board connector 21aA is connected to pin No. 24 of the first circuit board connector 20A via one of the lines of the pattern c23a. Pin Nos. 16 and 15 of the third circuit board connector 22A are connected by connecting pin Nos. 16 and 15 of the junction terminal 23a of the connection changing connector 22B shown in FIG. 2(a) and FIG. 2(b).

As is obvious from the above explanation, a signal line can be added by connecting the spare pins of the first circuit board connector 20A and the spare pins of a plurality of the second circuit board connectors 21aA, 21bA and 21cA, by utilizing the pins of the connection changing connector 22B capable of being attached to the third circuit board connector 22A.

When it is necessary to change the input/output signal transferred between the input/output circuit 18 and the numerically controlled machine tool 25, the change can be completed by changing the connection of the pins of the third circuit board connector 22A in the same way.

In the above explanation, the wire wrapping method is used for connecting the junction terminals of the connection changing connector, but a printed circuit board based on the pattern connection also can be used. Namely, a connection changing connector using a printed circuit board based on the pattern connection can be used as a semi-standard unit of another specification.

As another alternative, the connection of the junction terminals of the connection changing connector can be made by soldering with connecting wire. This method can be used as an emergency repair on site when a wire wrapping tool is not available.

As explained above, according to the present invention, the line branching printed circuit board is provided with spare signal paths, the third circuit board connector and a connection changing connector, so that the branching of a signal line can be easily changed by changing the connection of the junction terminals of the connection changing connector when it becomes necessary to increase or change the amount of input/output signals transferred between a computer numerical controller and a numerically controlled machine tool.

What is claimed is:

1. A line branching printed circuit board for a computer numerical controller, which branches input/output signal lines between the computer numerical controller and a numerically controlled machine tool, comprising
    a first circuit board connector coupled to a junction connector to which the input/output signal lines from the computer numerical controller are connected,
    a plurality of second circuit board connectors which are coupled to junction connectors to which the input/output signal lines to said numerically controlled machine tool are connected, said plurality of second circuit board connectors having pins being directly pattern-connected to pins of said first circuit board connector,
    a third circuit board connector having pins pattern-connected to spare pins of said first circuit board connector and spare pins of said plurality of second circuit board connectors, and
    a connection changing connector attached to said third circuit board connector and having means for determining the connection of the pins of said third circuit board connector to each other, thereby determining the connection of the spare pins of said first circuit board connector to the spare pins of said plurality of second circuit board connectors.

2. The line branching printed circuit board for a computer numerical controller according to claim 1, wherein said connection changing connector uses a wire wrapping method for connections between the junction terminals.

3. The line branching printed circuit board for a computer numerical controller according to claim 1, wherein said connection changing connector uses patterns on a printed circuit board for connecting the junction terminals.

4. The line branching printed circuit board for a computer numerical controller according to claim 1, wherein said connection changing connector uses soldered connecting wires for connecting the junction terminals.

5. The line branching printed circuit board for a computer numerical controller according to claim 1, wherein said connection changing connector includes a connecting wire arranged to operatively connect the pins of said third circuit board connector.

6. The line branching printed circuit board for a computer numerical controller according to claim 5, wherein said connecting wire is soldered to junction terminals of said connection changing connector.

7. The line branching printed circuit board for a computer numerical controller according to claim 5, wherein said connecting wire is wrap connected to junction terminals of said connection changing connector.

8. The line branching printed circuit board for a computer numerical controller according to claim 1, wherein said connection changing connector includes a printed circuit board having patterns arranged to operatively connect the pins of said third circuit board.

* * * * *

UNITED STATES PATENT AND TRADEMARK OFFICE
CERTIFICATE OF CORRECTION

PATENT NO. : 5,315,071
DATED      : May 24, 1994
INVENTOR(S): Akihiro Tanimichi

It is certified that error appears in the above-indentified patent and that said Letters Patent is hereby corrected as shown below:

Col. 1, line 23, delete ", but" and insert --.  But--.

Col. 5, line 13, delete "control" and insert --circuit--.

Signed and Sealed this

Thirtieth Day of August, 1994

Attest:

BRUCE LEHMAN

*Attesting Officer*    Commissioner of Patents and Trademarks